United States Patent [19]

Boll

[11] 4,408,130

[45] Oct. 4, 1983

[54] TEMPERATURE STABILIZED VOLTAGE REFERENCE

[75] Inventor: Harry J. Boll, Berkeley Heights, N.J.

[73] Assignee: Bell Telephone Laboratories, Incorporated, Murray Hill, N.J.

[21] Appl. No.: 308,657

[22] Filed: Oct. 5, 1981

[51] Int. Cl.[3] .......................... H03K 5/22; H03K 3/01

[52] U.S. Cl. ................................ 307/296 R; 307/297; 307/491; 307/494; 323/313

[58] Field of Search ................ 323/313, 281; 307/491, 307/494, 498, 501, 296 R, 297, 310

[56] References Cited

U.S. PATENT DOCUMENTS

| | | | |
|---|---|---|---|
| 3,976,896 | 8/1976 | Ryder | 307/494 |
| 4,068,134 | 1/1978 | Tobey, Jr. et al. | 307/297 |
| 4,165,478 | 8/1979 | Butler et al. | 323/281 |
| 4,260,946 | 4/1981 | Wheatley, Jr. | 323/281 |
| 4,384,217 | 5/1983 | Tsividis | 307/297 |

OTHER PUBLICATIONS

Pending U.S. Patent Application, Y. Tsividis (Case 2), Serial No. 262,461, filed May 11, 1981.

P. R. Gray et al., "A 4.3.2 Band-Gap-Referenced Biasing Circuits," Analysis and Design of Analog Integrated Circuits, 1977, pp. 254-261.

*Primary Examiner*—Stanley D. Miller
*Assistant Examiner*—B. P. Davis
*Attorney, Agent, or Firm*—David I. Caplan

[57] ABSTRACT

An integrated circuit voltage reference ($V_{REF}$) for MOS circuit utilization is supplied by the weighted difference amplification (30) of the voltages ($V_1$, $V_1'$) developed by a pair of separate similar networks (10, 10' or 100, 100') each of which comprises a base-emitter junction of a bipolar semiconductor transistor ($T_1$) whose emitter is connected to a first clocked voltage source ($C_1$, $C_2$, $M_1$, $M_2$) in a feedback loop of a difference amplifier ($A_1$) and whose collector is connected to receive output of a second clocked voltage source ($C_3$, $C_4$, $M_3$, $M_4$) and to deliver output to a first input terminal of the difference amplifier ($A_1$). In a preferred embodiment, a second input terminal of the difference amplifier ($A_1$) is supplied by the output voltage of an auxiliary voltage source ($C_5$, $C_6$, $M_6$, $M_7$, $M_8$, $M_9$) which is in another feedback loop of this amplifier ($A_1$).

9 Claims, 4 Drawing Figures

TEMPERATURE STABILIZED VOLTAGE REFERENCE

FIELD OF THE INVENTION

This invention relates to the field of semiconductor apparatus, and more particularly to MOS (metal oxide semiconductor) circuits for providing a voltage reference.

BACKGROUND OF THE INVENTION

Semiconductor integrated circuits often require a voltage supply or voltage reference circuit for providing a predetermined voltage level. The actual voltage level, however, as furnished by such a reference circuit undesirably tends to fluctuate during operation because of temperature variations in an underlying semiconductor body in which the circuit is integrated and because of voltage fluctuations in the power supply for the circuit. On the other hand, in the semiconductor art of analog-to-digital and digital-to-analog converter circuits, for example, a voltage reference is desirable which does not fluctuate in voltage level by more than typically about 0.005 volts or less. Therefore, steps must be taken to stabilize the reference circuit against temperature and power supply fluctuations.

In order to obtain a stable reference in either bipolar or complementary MOS (C-MOS) technology, the industry generally uses voltage references utilizing either the voltages associated with reverse breakdown phenomena in Zener diodes or the voltages provided by bandgap reference circuits. Such bandgap reference circuits are described, for example, in *Analysis and Design of Analog Integrated Circuits*, Paul R. Gray and Robert G. Meyer, at pp. 249–261. In N-MOS (or N-channel) technology (which uses a P-type semiconductor substrate) none of the above-mentioned voltage references is feasible. More specifically, Zener diode reverse breakdown phenomena cannot easily be used because all PN junctions are designed to withstand the highest possible reverse voltage available on the semiconductor chip in which the circuits are all integrated; hence these junctions cannot readily be driven into reverse breakdown. Moreover, known bandgap reference circuits cannot easily be used since they require constantly forward biased junctions which are not easily obtainable because the P-type substrate of an N-MOS integrated circuit is connected to the most negative potential in the system, and thus the requisite constantly forward biased junctions cannot easily be obtained. Accordingly, to implement either reverse breakdown Zener or bandgap reference circuits in N-MOS technology would require additional costly fabrication steps, which would impair the economic advantage in N-MOS technology.

It would therefore be desirable to have a voltage reference circuit which can readily be fabricated in N-MOS technology.

SUMMARY OF THE INVENTION

According to the invention, a voltage reference ($V_{REF}$) is furnished by weighted difference amplification (30) (FIG. 3) of the voltages ($V_1$, $V_1'$) developed at the output terminals (11, 11') of difference amplifiers, (e.g., $A_1$) in a pair of separate networks (10, 10' in FIG. 1; 100, 100' in FIG. 4), each of said networks (e.g., 10 or 100) comprising a base-emitter PN junction of a semiconductor transistor device ($T_1$) whose emitter is connected to receive output of a first clocked voltage source ($C_1$, $C_2$, $M_1$, $M_2$, $M_5$) and whose collector is connected both to receive output of a second clocked voltage source ($C_3$, $C_4$, $M_3$, $M_4$) and to deliver output of said transistor ($T_1$) to a first input terminal (+) of a difference amplifier ($A_1$), and the output terminal (12) of the difference amplifier ($A_1$) being connected to an input terminal (18) of the first clocked voltage source in order that voltage be supplied to said first clocked source by said difference amplifier ($A_1$). In a preferred embodiment (100), which isolates $V_{REF}$ from the voltage supply $V_{DD}$, a second input terminal (−) of said difference amplifier ($A_1$), of opposite polarity from said first input terminal (+) thereof, is connected to receive output of a third voltage source ($C_5$, $C_6$, $M_6$, $M_7$, $M_8$, $M_9$) which is also supplied voltage by said difference amplifier ($A_1$). By properly selecting the weighting factors of the weighted amplification (30), the resulting voltage reference ($V_{REF}$) can also be made to be relatively stable against temperature fluctuations.

BRIEF DESCRIPTION OF THE DRAWINGS

This invention may be better understood from the following detailed description when read in conjunction with the drawing in which.

DETAILED DESCRIPTION

Figure 1:
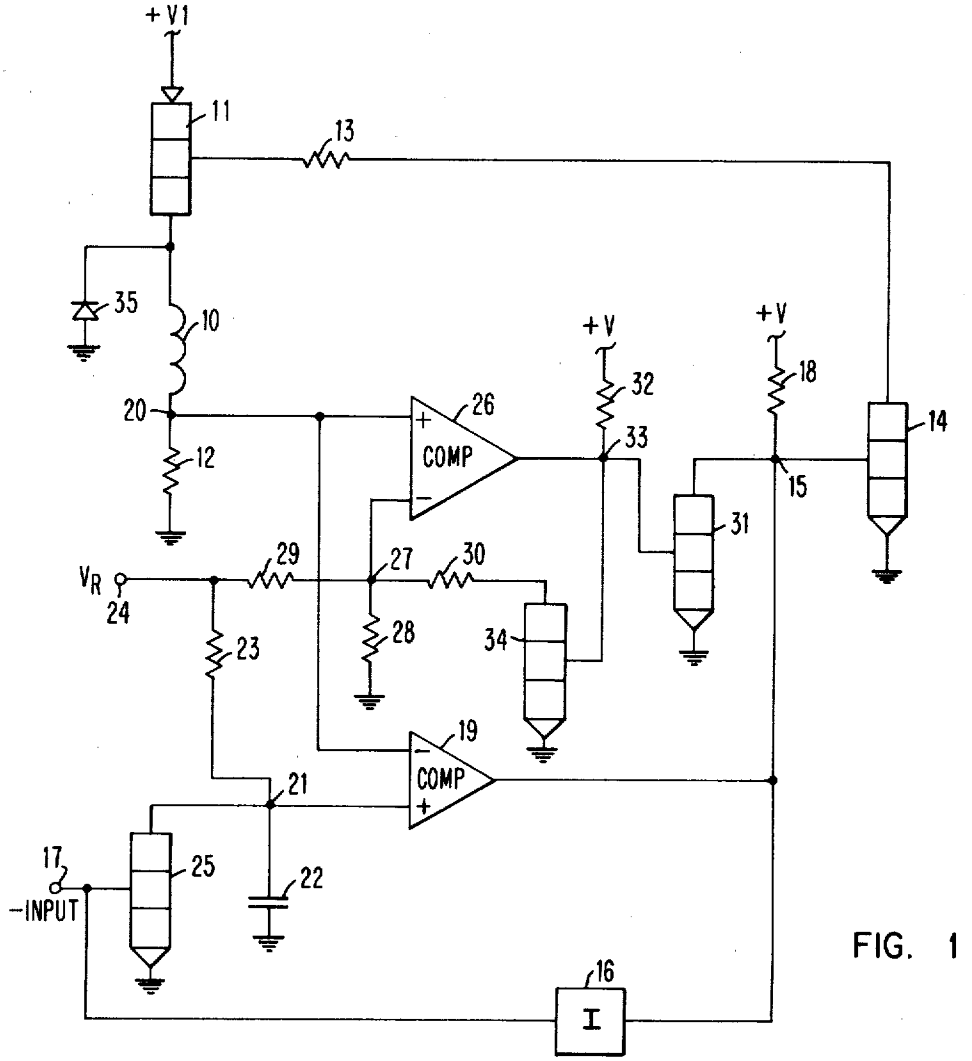
FIG. 1 is a schematic circuit diagram of an electrical network for producing a first voltage ($V_1$) useful in a specific embodiment of the invention.
Figure 3:
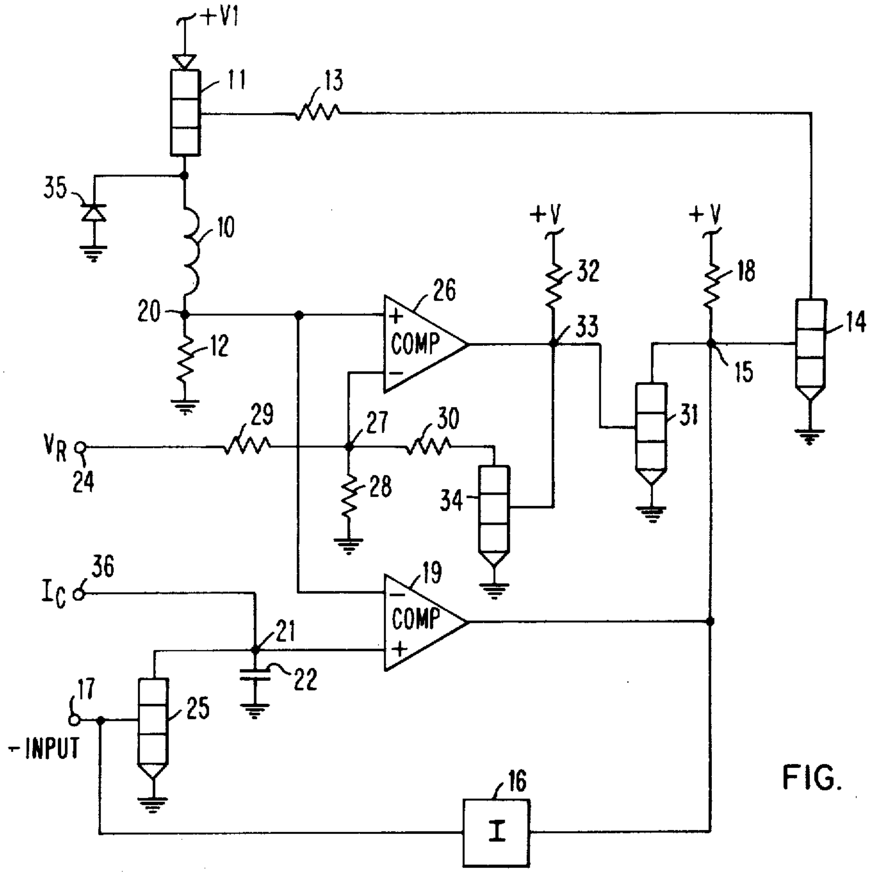
FIG. 3 is a diagram of a circuit for producing a voltage reference in accordance with the invention.

FIG. 1 shows a first network 10 which produces a first voltage $V_1$ at a first node 11. A second network 10', which is identical to the first network 10 except for the selection of different parameters for some or all of the various elements as described in more detail below, produces a second voltage $V_1'$ at a second node 11' (FIG. 3). These first and second nodes 11 and 11' serve as input nodes of a weighted difference amplifier 30 (FIG. 3) in a voltage reference circuit 40 to produce, in accordance with the invention, the desired voltage reference $V_{REF}$. This weighted difference amplifier 30 is typically formed by an operational amplifier $A_F$, in combination with weighting capacitors $C_7$, $C_8$, $C_9$, and $C_{10}$. All these capacitors can advantageously be MOS capacitors.

Figure 2:
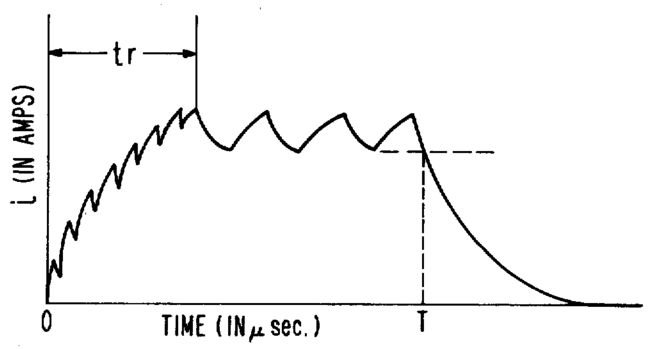
FIG. 2 illustrates a sequence of phases of clock voltages useful in the operation of the network of FIG. 1.

As further shown in FIG. 1, MOSFET switching device elements $M_1$, $M_3$, and $M_5$ are controlled by a first clock pulse sequence $\phi_1$ (FIG. 2) which periodically turns these devices "on" during repeated positive voltage pulse phases (N-MOS) technology); and MOSFET switching devices $M_2$ and $M_4$ are controlled by a second clock pulse sequence $\phi_2$ which periodically turns these latter switching devices "on" during complementary (non-overlapping with $\phi_1$) phases when the first sequence $\phi_1$ turns "off" the devices $M_1$, $M_3$ and $M_5$. A bipolar transistor $T_1$, whose base is grounded ("zero" substrate bias potential level), has its high current collector-emitter path connected between nodes 15 and 14. Node 15 serves as an output terminal of a first clocked voltage pulse source formed by $C_1$, $C_2$, $M_1$, $M_2$;

whereas node 14 serves as an output terminal of a second clocked pulse source formed by $C_3$, $C_4$, $M_3$ and $M_4$. This transistor $T_1$ will be "on" and will pass emitter-collector current only when the base-emitter voltage $V_{BE}$ exceeds a threshold $V_{BE.th}$; that is, when the emitter is more negative than about −0.6 volt in the usual case of silicon semiconductor. A positive polarity input terminal (+) of a difference amplifier $A_1$ is connected to node 14 while an output terminal of this amplifier $A_1$ is connected to the node 11.

Advantageously, the amplifier $A_1$ is an operational type amplifier, that is, of very high input impedance, and very high gain $\beta$: a voltage gain factor in the range of typically about 5 to 20 or more. An output terminal 13 of a voltage divider resistor R supplies an input voltage $V_R$, a predetermined fraction of a supply voltage $V_{DD}$, as input to a negative polarity input terminal (−) of the difference amplifier $A_1$.

Typically, the amplifier $A_1$ is a MOSFET source follower amplifier; so that the MOSFET device of this amplifier together with the MOSFET devices $M_1 \ldots M_5$, the bipolar transistor $T_1$, and the MOS capacitor $C_1 \ldots C_8$ can be advantageously integrated in a single crystal semiconductor body as known in the art of integrated circuits. For proper operation, $C_4$ is selected to be much larger than $C_3$, advantageously by a factor of 100 or more.

During a phase of operation when transistor devices $M_1$, $M_3$ and $M_5$ controlled by the first clock sequence $\phi_1$ are "on" and hence devices $M_2$ and $M_4$ controlled by the second clock sequence $\phi_2$ are "off", the top plate of capacitor $C_1$ (connected to node 17 between $M_1$ and $M_2$) is at potential $V_1$ and its bottom plate grounded. The top and bottom plates of $C_1$ then carry charges equal to $\pm C_1V_1$, respectively, while both the plates of capacitor $C_2$ are grounded, so that these plates are thus completely uncharged. Thus the top plate of capacitor $C_3$ is then at potential $V_{DD}$ while the top plate of $C_4$ (connected to node 14) is electrically floating because the base-emitter potential of the bipolar transistor $T_1$ then is zero and hence $T_1$ is then "off". The top plate of $C_3$ will thus be charged to a value $q_3=C_3V_{DD}$. During this phase also, the potential $V_{14}$ at node 14 is not significantly different from the potential $V_R$ at node 13 because of the high gain $\beta$ of the difference amplifier $A_1$ which will not allow $V_{14}$ to differ very much from $V_R$.

During the next succeeding phase, the first clock $\phi_1$ turns "off" the devices $M_1$, $M_3$ and $M_5$, while the second clock $\phi_2$ turns "on" the devices $M_2$ and $M_4$. Accordingly, node 17 between $M_2$ and $M_1$ is grounded while the top plate of $C_2$ (connected to nodes 15 and 16) is disconnected by $M_5$ from ground. Accordingly, the charge $C_1V_1$ initially on $C_1$ distributes itself such that the charge on the top plate of $C_2$ becomes equal to $q_2$ where:

$$q_2 V_1 C_1 C_2/(C_1+C_2). \tag{1}$$

Thus, the potential $V_{16}$ at node 16 (between $C_1$ and $C_2$) becomes equal to $V_{16}=q_2/C_2$ or:

$$V_{16}=-V_1C_1/(C_1+C_2). \tag{2}$$

Accordingly, a positive charge $q_1$ will flow through the transistor $T_1$ if $V_{12}$ is then more negative than $V_{BE.th}$, the base-emitter threshold of $T_1$. This charge $q_1$ will flow from the emitter of $T_1$ to the node 16, and hence a charge $\alpha q_1$ will be transferred from the top plate of $C_4$ at node 14 to the collector of $T_1$, where $\alpha$ denotes the collection efficiency of $T_1$ and ordinarily is nearly equal to unity. This charge $\alpha q_1$ will thus be equal to $$\alpha q_1=(V_{BE.th}-V_{16})(C_1+C_2) \tag{3}$$

so long as $V_{16}$ is more negative than $V_{BE.th}$ (because during this "on" phase of $\phi_2$ the capacitors $C_1$ and $C_2$ are thus also in parallel, looking from node 16 to ground). Meanwhile, another charge $q_4$ is transferred into $C_4$from $C_3$ through $M_4$, this charge being approximately of magnitude $q_4=C_3(V_{CC}-V_{14})$ since $C_3$ is much smaller than $C_4$. The voltage of node 14 is substantially equal to $V_R$ because of the high gain of the amplifier $A_1$ and because of a resulting overall negative feedback through $C_1$ and $T_1$ back to $A_1$; therefore this charge $q_3$ is substantially equal to:

$$q_4=C_3(V_{DD}-V_R). \tag{4}$$

At equilibrium the voltage at node 14 remains unaffected by the transfer of charges $\alpha q_1$ and $q_4$, so that $\alpha q_1=q_4$; that is, at equilibrium:

$$\alpha(V_{BE.th}-V_{16})(C_1+C_2)=C_3(V_{CC}-V_R). \tag{5}$$

Replacing $V_{16}$ by its value given by Equation 2:

$$\alpha V_1C_1+\alpha V_{BE.th}(C_1+C_2)=C_3(V_{DD}-V_R), \tag{6}$$

at equilibrium. Solving for $V_1$, at equilibrium:

$$V_1=V_{BE.th}(C_1+C_2)/C_1+(V_{DD}-V_R)C_3/\alpha C_1. \tag{7}$$

Thus, the first voltage $V_1$ produced by the first network 10 tends to the equilibrium value given by Equation 7. On the other hand, the second voltage $V_1'$ (FIG. 3) produced by the second network 10' (similar to the first network 10 except for different values of some or all respective parameters) will tend to:

$$V_1'=V_{BE.th}'(C_1'+C_2')/C_1'+(V_{DD}-V_R')C_3'/\alpha'C_1' \tag{8}$$

where the primed quantities denote elements in the second network 10' similarly situated and interconnected, respectively, as corresponding unprinted elements in the first network 10. The weighted difference amplifier 30 (FIG. 3) thus is provided, after equilibrium is established in both networks 10 and 10', with an input of $V_1$ at node 11 given by Equation 7 and an input of $V_1'$ at node 11' given by Equation 8.

Clocked transistors $M_{10}$ and $M_{11}$ periodically discharged $C_8$ and $C_9$, respectively, in order to reset periodically the amplifier $A_F$. The desired reference $V_{REF}$ is provided at the output terminal of the amplifier $A_F$in accordance with the relationship:

$$V_{REF}=aV_1-bV_1'-V_{os} \tag{9}$$

where $V_{os}$ is an offset voltage of the amplifier $A_F$, and where $$a=C_7(C_9+C_{10})/C_{10}(C_7+C_8) \tag{10}$$

and $$b=C_9/C_{10}. \tag{11}$$

The offset $V_{os}$ can be removed, if desired, by a variety of known offset cancellation techniques, such as charging an auxiliary capacitor to $V_{os}$ during the "on" phases of transistor $M_{10}$ and $M_{11}$, and then connecting this capacitor in series between node 22 (between $C_7$ and $C_8$) and the positive input terminal of the amplifier $A_F$.

It should be understood that the value of the parameters of the various elements in the first network 10 (FIG. 1) will, in general, be different from the corresponding elements in the network 10'; in particular, the base-emitter voltage of the bipolar transistor $T_1'$ in the second network 10' should be at least slightly different from that of its counterpart bipolar transistor $T_1$ in the first network 10, as discussed more fully below. Of course, the various switching transistor device elements $M_1 \ldots M_5$, and $M_1' \ldots M_5'$ can all have the same parameters. It should also be understood that the desired value of $V_{REF}$ is present at the output terminal of the amplifier $A_F$ only when the transistors $M_{10}$ and $M_{11}$ are "off", the output of $A_F$ being equal to zero when these transistors are "on"; thus, for a steady (DC) output of $V_{REF}$ known sample and hold techniques should be employed.

Figure 4:
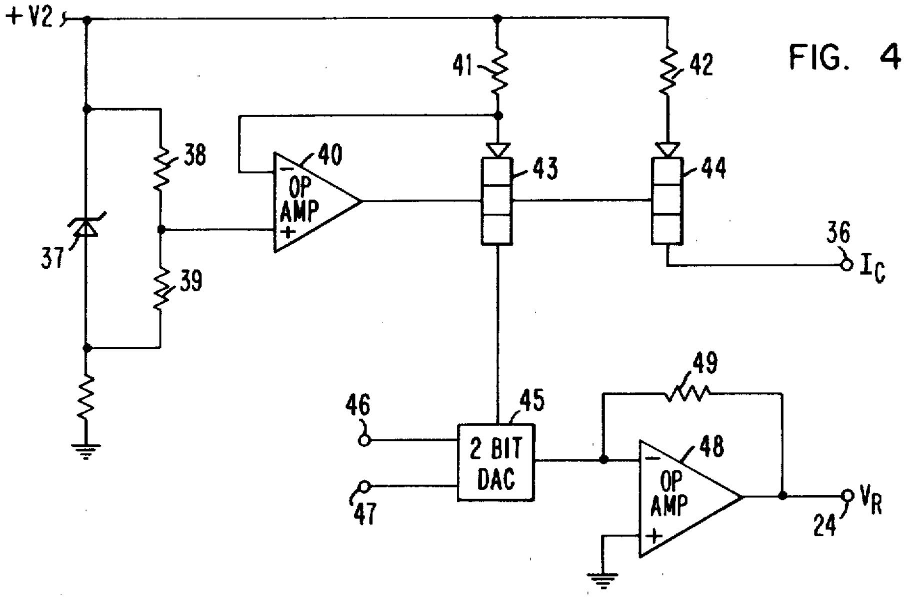
FIG. 4 is a schematic circuit diagram of an electrical network for producing the first voltage ($V_1$) useful in a preferred specific embodiment of the invention.

FIG. 4 shows a network 100 of the kind which can be used as an alternative to the network 10 or 10' (or preferably both) in the circuits of FIG. 3. This network 100 is similar to the network 10 except for added elements $C_5$, $C_6$, $C_{SM}$, $M_6$, $M_7$, $M_8$ and $M_9$ and an added resistor 43—all instead of the voltage divider R in network 10—for supplying $V_R$ to the negative input terminal (−) of the difference amplifier $A_1$. Accordingly, in the preferred embodiment, the network 100 replaces the network 10 in the circuit 30, while a network 100', constructed similarly to the network 100 except for the values of the parameters, likewise replaces the network 10'. The added elements $C_5$, $C_6$, $C_{SM}$, $M_6$, $M_7$, $M_8$ and $M_9$ form a third voltage souce means in the network 100, in order to provide the voltage $V_R$ to the negative input terminal of the amplifier $A_1$ independently of the value of $V_{DD}$ and hence to avoid the dependence of the ultimate output $V_{REF}$ (FIG. 3) upon the instantaneous value of $V_{DD}$. An added resistor device 43 provides a convenient current from the $V_{DD}$ supply to the node 14, in order to provide an initial ("start-up") voltage typically of the order of one-tenth microampere, eventually to provide an initial voltage at this the node 14, typically an initial voltage of about one volt or more, depending on the value of $V_1$ and the parameter of the circuit. In any event, the resistance of the device 43 is selected such that this device delivers a current equal to about only a few percent of the collector current of the transistor $T_1$ during operation.

The capacitor $C_{SM}$ is placed in the network 100 for smoothing the input voltage $V_R$ developed at an output terminal 42 of the third voltage means $C_5$, $C_6$, $M_6$, $M_7$, $M_8$ and $M_9$. This voltage $V_R$ is supplied by charge division and hence voltage division (of $V_1$) by capacitors $C_5$ and $C_6$. More specifically, when $\phi_2$ turns "on" the transistor $M_6$, the capacitor $C_5$ is charged to $V_1$ while the capacitor $C_6$ is discharged through the transistor $M_9$ to ground. Subsequently, when $\phi_1$ turns "on" the transistors $M_7$ and $M_8$, the capacitors $C_5$ and $C_6$ are connected in parallel between ground and the negative input terminal of the difference amplifier $A_1$. Consequently, the voltage $V_R$ supplied to this negative input terminal of $A_1$ is equal to:

$$V_R = V_1\, C_5/(C_5+C_6). \tag{12}$$

In all other respects, i.e., except for the way in which $V_R$ is generated, the network 100 operates in the same manner as discussed above in connection with the network 10. In the network 100, however, the voltage $V_1$ is given by the following variant of Equation 7 above:

$$V_1 = V_{BE.th}(C_1+C_2)/C_1 + (V_1 - V_R)C_3/aC_1. \tag{13}$$

Now, using the value of $V_R$ found in Equation 12:

$$V_1 = V_{BE.th}(C_1+C_2)/C_1 + V_1C_6C_3/aC_1(C_5+C_6)$$

or:

$$V_1 = mV_{BE.th} \tag{14}$$

with:

$$m = \frac{(C_1 + C_2)(C_5 + C_6)}{C_1(C_5 + C_6) - C_3C_6/a}$$

or:

$$m = \frac{1 + C_2/C_1}{1 - C_3C_6/aC_1(C_5 + C_6)}. \tag{15}$$

Similarly, for the network 10';

$$V_1' = m'V_{BE.th}' \tag{16}$$

with:

$$m' = \frac{1 + C_2'/C_1'}{1 - C_3'C_6'/a'C_1'(C_5' + C_6')}. \tag{17}$$

On the other hand, $V_1$ and $V_1'$ are functions of temperature, since the corresponding base-emitter threshold voltages $V_{BE.th}$ and $V_{BE.th}'$ (in $T_1$ and $T_1'$, in the networks 100 and 100') are themselves dependent on temperature. These base-emitter voltages are the same as the forward diode voltage drops of the respective base-emitter junctions and depend upon the respective current densities J and J', respectively, in the bipolar transistors $T_1$ and $T_1'$. Accordingly, the calculations of the patent application Ser. No. 262,461, filed on May 11, 1981 by Y. P. Tsividis (Case 2) entitled "Temperature Stabilized Voltage Reference Circuit," Now U.S. Pat. No. 4,384,217, are applicable for selecting suitable parameters, particularly of the capacitances $C_7$, $C_8$, $C_9$ and $C_{10}$ for weighting the amplifier 30 (FIG. 3); except that (neglecting $V_{os}$) in the present case:

$$V_{REF} = aV_1 - bV_1' = amV_{BE.th} - bm'V_{BE.th}' \tag{18}$$

where a and b are the weighting factors given by Equations 10 and 11 above.

Now, the base-emitter thresholds $V_{BE.th}$ and $V_{BE.th}'$ are functions of temperature and their values at room (operating) temperature are to be used in Equation 18. Accordingly, the conditions on am and bm' can be found in a similar manner as in the above-mentioned Tsividis patent application:

$$am = h\frac{V_{xo} - V'_{BE\cdot th}}{V_{BE\cdot th} - V'_{BE\cdot th}} \tag{19}$$

$$bm' = h\frac{V_{xo} - V_{BE\cdot th}}{V_{BE\cdot th} - V'_{BE\cdot th}} \tag{20}$$

with:

$$V_{REF}=hV_{xo} \quad (21)$$

where $V_{xo}$ is the linearly extrapolated value from room temperature to absolute zero of $V_{Be.th}$, and also that of $V_{Be.th}'$, which is the same extrapolated value as that of $V_{Be.th}$. For silicon $V_{xo}$ is equal to about 1.2 volts, although it may not be exactly the same to two decimal places as in the aforementioned Tsividis patent application, owing to the temperature-dependent current source therein. As further noted in that patent application, in order to achieve reasonable matching and semiconductor area economy, a and b should both be less than about a hundred.

As explained in the aforementioned Tsividis patent application, $V_{BE.th}$ and $V_{Be.th}'$ are functions of temperature, $V_{BE.th}$ (T) and $V_{BE.th}'$ (T). Extrapolating linearly the values of BE.th (T) and $V_{BE.th}'$ (T) from $T=T_x$ (with say, $T_x$=room temperature) to $T=0°$ K., it is found that these linearly extrapolated values are equal to the same value denoted by $V_{xo}$. The difference $(V_{BE.th}-V_{BE.th}')$ of the base-emitter voltages at room temperature of the transistors $T_1$ and $T_1'$ in the networks 100 and 100' is obtained by using different current densities in those transistors $T_1$ and $T_1'$: the higher the current density, the higher the base-emitter voltage in accordance with the relationship:

$$V_{BE.th}-V_{BE.th}'=(kT/q)\ ln(J/J'). \quad (22)$$

These current densities, J and J', are proportional to the collector-base charge transfer $q_4$ given by Equation 4 above for the network 10. For the network 100, this collector-base charge $q_4$ is given by:

$$q_4=C_3(V_1-V_R)=C_3V_1/(1+C_5/C_6). \quad (23)$$

Since the current density J in the transistor $T_1$ is proportional to $q_4$ and inversely proportional to the base-emitter junction area A in the transistor $T_1$, the base-emitter thresholds $V_{BE.th}$ and $V_{BE.th}'$ can be made to differ, in accordance with Equation 22, by as much as a tenth of a volt or so, while further selecting $C_1=C_1'$, $C_4=C_4'$, $C_5=C_5'$, and $C_6=C_6'$, and while making the ratio (A'/A) of base-emitter junction areas of $T_1$ and $T_1'$ significantly different from unity (but not more than about a hundred for reasonable device areas). Conversely, instead of this ratio for A/A', select A/A' equal to unity, and select suitable ratios for the capacitances or preferably select suitable values simultaneously for both junction area ratio and capacitance ratios to obtain minimum overall device area.

On the other hand, since $V_1$ is inherently less than $V_{DD}$ (FIG. 1, and implicitly in FIG. 4 also), it follows from Equation 14 that m should be selected to be less than $V_{DD}/V_{BE.th}$. Moreover, since $V_{DD}$ is ordinarily equal to about 5 volts and $V_{BE.th}$ is equal to about 0.6 volts (to within about 0.1 volt at room temperature for reasonable current densities), it thus follows that m should be selected to be less than about 5/0.6=8. Similarly, m' should likewise be selected to be less than about 8. Setting m and m' to be equal to some convenient value (less than 8) imposes a condition (Equation 15) among the capacitors $C_1$, $C_2$, $C_3$, $C_5$ and $C_6$ and a condition (Equation 17) among $C_1'$, $C_2'$, $C_3'$, $C_5'$ and $C_6'$; both of these conditions are easily satisfied, for example, by choosing the capacitors $C_1=C_2=C_3=C_5=C_6$ and $C_1'=C_2'=C_3'=C_5'=C_6'$, in which case it follows from Equations 15 and 17 that $m=4\alpha/(2\alpha-1)$ and that $m'=4\alpha'/(2\alpha'-1)$, where $\alpha$ and $\alpha'$ (of transistors $T_1$ and $T_1'$) are both approximately equal to unity; so that m and m' are then both approximately equal to 4.

As an illustrative example, to obtain a voltage reference $V_{REF}$ of about 1.2 volts (less an offset $V_{os}$, if any), according to Equation 21, we have h=1 since $V_{xo}$ is also about 1.2 volts in silicon technology. Since both $V_{BE.th}$ and $V_{BE.th}'$ are approximately 0.6 volt (to within about 0.1 for reasonable base-emitter junction areas in silicon), from the conditions that a should be less than about 100 and that m is equal to about 4, it follows from Equations 19 and 20 that $V_{BE.th}-V_{BE.th}'$ should be greater than about 0.6/4×100 or 0.0015 volt. Hence, ln(J/J') from Equation 22 should be greater than about 0.0015/0.026=0.06 at room temperature (about 300° K.); hence the base-emitter current density ratio itself (J/J') should be greater than about exp (0.06) or about 1.06 at room temperature. The required values of am and bm' can then be calculated from Equations 19 and 20; and finally a and b can be calculated for the given choice of m=m'=4.

Similarly, for a reference $V_{REF}$ of about 6 volts, i.e., for the base h=5, the quantity $(V_{BE.th}-V_{BE.th}')$ should be greater than about 5×0.6/4×100=0.0075, and ln(J/J') greater than about 0.0075/0.026=0.29 at room temperature; and hence (J/J') should be greater than about $e^{0.29}$ or about 1.33 at room temperature.

All of the MOSFETs in the networks 10 or 100 and 30 can be N-channel transistor devices or alternatively P-channel devices. The entire voltage reference circuit 40 can thus be integrated in a single silicon body in accordance with ordinary semiconductor integrated circuit techniques.

Although the invention has been described in detail with respect to specific embodiments, various modifications can be made without departing from the scope of the invention. For example, $\phi_1$ and $\phi_2$ controlling $M_3$ and $M_4$ (FIGS. 1 or 4) can be interchanged and likewise $M_7$ and $M_8$ (FIG. 4) can be controlled by $\phi_2$ while $M_6$ and $M_9$ are controlled by $\phi_1$; also $M_1$ and $M_{11}$ can be controlled by $\phi_2$ (or some other suitable periodic clock) instead of $\phi_1$.

What is claimed is:

1. A network (10 or 100) comprising (a) a bipolar transistor ($T_1$);

(b) first clocked voltage source means ($C_1$, $C_2$, $M_1$, $M_2$, $M_5$) having an input terminal (18) and an output terminal (15);

(c) means for connecting the output terminal (15) of the first clocked means ($C_1$, $C_2$) to an emitter terminal of said transistor ($T_1$);

(d) second clocked voltage source means ($C_3$, $C_4$, $M_3$, $M_4$) having an output terminal (14);

(e) means for connecting the output terminal (14) of said second clocked means ($C_3$, $C_4$, $M_3$, $M_4$) to a collector terminal of said transistor ($T_1$);

(f) a difference amplifier ($A_1$) having first (+) and second (−) input terminals of opposite polarity;

(g) means for connecting said collector terminal of said transistor ($T_1$) to the first input terminal (+) of said difference amplifier ($A_1$); and (h) means for connecting an output terminal (12) of said difference amplifier ($A_1$) to the input terminal (18) of said first clocked means ($C_1$, $C_2$, $M_1$, $M_2$, $M_5$), the output terminal (12) of said difference amplifier ($A_1$) being connected to an output terminal (11) of said network (10 or 100).

2. A network (100) according to claim 1 further comprising:

third voltage source means ($C_5$, $C_6$, $M_6$, $M_7$, $M_8$, $M_9$) having an input terminal (41) thereof connected to the output terminal (12) of the difference amplifier and having an output terminal (42) thereof connected to the second input terminal (−) of said difference amplifier ($A_1$).

3. A voltage reference circuit (40) comprising:

(a) first and second networks (10 and 10' or 100 and 100') each in accordance with claim 1 or 2, said second network having a second network output terminal (11'); and (b) means for connecting the output terminals (11, 11') of the first and second networks separately to first and second input terminals (31, 32), respectively, of a weighted difference amplifier ($A_F$, $C_7$, $C_8$, $C_9$, $C_{10}$).

4. A voltage reference circuit (40) according to claim 3 in which the weighting factor a and b at least approximately satisfy:

$$am = h\frac{V_{xo} - V'_{BE \cdot th}}{V_{BE \cdot th} - V'_{BE \cdot th}}$$

$$bm' = h\frac{V_{xo} - V_{BE \cdot th}}{V_{BE \cdot th} - V'_{BE \cdot th}}$$

where $V_{BE.th}$ and $V_{BE.th}'$ are the room temperature base-emitter junction threshold voltages of the bipolar transistor ($T_1$, $T_1'$), respectively, in the first and second networks, where $V_{xo}$ is the linearly extrapolated value of the base-emitter threshold voltage of the first transistor ($T_1$) from room temperature to absolute zero, h is the ratio ($V_{REF}/V_{xo}$), m is the ratio ($V_1/V_{BE.th}$), and m' is the ratio ($V_1'/V_{Be.th}'$).

5. An electrical network (10 or 100) comprising:

(a) a bipolar transistor ($T_1$) having separate emitter, base, and collector terminals;

(b) first clocked capacitor means ($C_1$, $C_2$), having an output terminal (15) thereof connected to said emitter terminal, for periodically delivering first electrical charges to said emitter terminal;

(c) second clocked capacitor means ($C_3$, $C_4$), having an output terminal (14) thereof connected to said collector terminal, for periodically delivering second electrical charges to said collector terminal;

(d) a difference amplifier ($A_1$) having an output terminal (12) connected to an input terminal (18) of said first clocked means ($C_1$, $C_2$) and having an input terminal of one polarity connected to said collector terminal; and (e) a network output terminal (11) connected to the output terminal (12) of said amplifier ($A_1$).

6. A network (100) according to claim 5 further comprising:

third means ($C_6$, $C_7$) having an output terminal (42) thereof connected to a second input terminal of the amplifier ($A_1$) of opposite polarity from that of the first input terminal thereof, for providing an input voltage ($V_R$) to said second input terminal of the amplifier ($A_1$).

7. A network (100) according to claim 6 further comprising conductive means for connecting an input terminal (14) of said third clocked means ($C_6$, $C_7$) to the output terminal (12) of said amplifier ($A_1$).

8. A voltage reference circuit (40) comprising:

(a) first and second networks (10 and 10' or 100 and 100') each in accordance with claim 5, 6 or 7, said second network having a second network output terminal (11'); and (b) means for connecting the output terminals (11, 11') of the first and second networks separately to first and second input terminals (31, 32), respectively, of a weighted difference amplifier (30), whereby an output terminal of the weighted difference amplifiers during operation generates a voltage $V_{REF}=aV_1-bV_1'$, where a and b are weighting factors of said weighted difference amplifier (30).

9. A voltage reference circuit (40) according to claim 8 in which the weighting factors a and b satisfy:

$$am = h\frac{V_{xo} - V'_{BE \cdot th}}{V_{BE \cdot th} - V'_{BE \cdot th}}$$

$$bm' = h\frac{V_{xo} - V_{BE \cdot th}}{V_{BE \cdot th} - V'_{BE \cdot th}}$$

where $V_{Be.th}$ and $V_{BE.th}'$ are the room temperature base-emitter junction threshold voltages of the bipolar transistors ($T_1$, $T_1'$, respectively, in the first and second networks, where $V_{xo}$ is the linearly extrapolated value of the base-emitter threshold voltage of the first transistor ($T_1$) from room temperature to absolute zero, h is the ratio ($V_{REF}/V_{xo}$), m is the ratio ($V_1/V_{BE.th}$), and m' is the ratio ($V_1'/V_{BE.th}'$).

* * * * *